(12) United States Patent
Matsumoto

(10) Patent No.: US 9,781,820 B2
(45) Date of Patent: Oct. 3, 2017

(54) DEVICE AND A COOLING STRUCTURE

(71) Applicant: NEC Corporation, Minato-ku, Tokyo (JP)

(72) Inventor: Yuki Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/072,531

(22) Filed: Mar. 17, 2016

(65) Prior Publication Data

US 2016/0278198 A1 Sep. 22, 2016

(30) Foreign Application Priority Data

Mar. 20, 2015 (JP) ................................. 2015-057532

(51) Int. Cl.
| | |
|---|---|
| *H05K 7/20* | (2006.01) |
| *H05K 1/02* | (2006.01) |
| *H01L 23/36* | (2006.01) |
| *H01L 23/367* | (2006.01) |
| *H01L 23/467* | (2006.01) |

(Continued)

(52) U.S. Cl.
CPC ............ *H05K 1/0203* (2013.01); *G06F 1/20* (2013.01); *H01L 23/36* (2013.01); *H01L 23/3672* (2013.01); *H01L 23/3675* (2013.01); *H01L 23/467* (2013.01); *H05K 1/181* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | | |
|---|---|---|---|---|
| 2002/0041487 | A1* | 4/2002 | McCullough | ......... H01L 23/367 361/704 |
| 2003/0198021 | A1* | 10/2003 | Freedman | .............. B82Y 30/00 361/705 |

(Continued)

FOREIGN PATENT DOCUMENTS

| | | |
|---|---|---|
| JP | H06-334357 A | 12/1994 |
| JP | H08-222672 A | 8/1996 |

(Continued)

OTHER PUBLICATIONS

Japanese Office Action for JP application No. 2015-057532 mailed on Dec. 24, 2015 with English Translation.

*Primary Examiner* — Anthony Haughton
*Assistant Examiner* — Razmeen Gafur

(57) ABSTRACT

A device includes: a substrate; a heat-generating component which is mounted on a first surface of the substrate; a heat sink which is thermally coupled with the heat-generating component; and a frame which is attached on the first surface of the substrate. The heat sink includes a first fin extending in a direction away from the first surface, and the frame includes a second fin which is arranged on the frame, and the second fin extends in a direction away from the first surface. The first fin extends higher than bottom side of the second fin toward top side of second fin.

9 Claims, 8 Drawing Sheets

(51) Int. Cl.
*G06F 1/20* (2006.01)
*H05K 1/18* (2006.01)

(56) References Cited

U.S. PATENT DOCUMENTS

| | | | |
|---|---|---|---|
| 2005/0201062 A1* | 9/2005 | Matteson | H01L 23/42 361/704 |
| 2005/0207115 A1* | 9/2005 | Barsun | G06F 1/20 361/690 |
| 2005/0254213 A1* | 11/2005 | Wang | G06F 1/20 361/697 |
| 2006/0007660 A1* | 1/2006 | Yatskov | H01L 23/4006 361/709 |
| 2006/0037735 A1* | 2/2006 | Connors | F28D 15/0233 165/80.3 |
| 2006/0146499 A1* | 7/2006 | Reents | H01L 23/4093 361/704 |
| 2007/0047211 A1* | 3/2007 | Refai-Ahmed | H01L 23/4093 361/720 |
| 2007/0133175 A1* | 6/2007 | Wu | F28D 15/0275 361/704 |
| 2007/0171616 A1* | 7/2007 | Peng | H01L 23/427 361/700 |
| 2007/0211436 A1* | 9/2007 | Robinson | H01L 23/552 361/719 |
| 2007/0263358 A1* | 11/2007 | Chen | H01L 21/4882 361/704 |
| 2008/0041562 A1* | 2/2008 | Bhatia | G06F 1/20 165/80.3 |
| 2008/0043438 A1* | 2/2008 | Refai-Ahmed | F28D 15/0266 361/700 |
| 2008/0266800 A1* | 10/2008 | Lankston | F28D 15/0233 361/700 |
| 2008/0266808 A1* | 10/2008 | Aberg | H01L 23/4006 361/709 |
| 2009/0021917 A1* | 1/2009 | Floyd | H01L 23/4093 361/719 |
| 2009/0116195 A1* | 5/2009 | Yang | H01L 23/3675 361/709 |
| 2011/0063802 A1* | 3/2011 | Chen | H05K 7/20154 361/709 |
| 2011/0090649 A1* | 4/2011 | Chan | H01L 23/367 361/709 |
| 2011/0279970 A1* | 11/2011 | Guan | G06F 1/20 361/679.47 |
| 2012/0170224 A1* | 7/2012 | Fowler | H05K 7/1424 361/720 |
| 2013/0170142 A1* | 7/2013 | Weaver, Jr. | H01L 23/427 361/701 |
| 2014/0071631 A1* | 3/2014 | So | H01L 23/4006 361/720 |

FOREIGN PATENT DOCUMENTS

| | | |
|---|---|---|
| JP | 1998-070383 A | 3/1998 |
| JP | 2000-332177 A | 11/2000 |
| JP | 2007-005397 A | 1/2007 |
| JP | 2008-205034 A | 9/2008 |
| JP | 2013-165120 A | 8/2013 |

* cited by examiner

DEVICE AND A COOLING STRUCTURE

This application is based upon and claims the benefit of priority from Japanese Patent Application No. 2015-057532, filed on Mar. 20, 2015, the disclosure of which is incorporated herein in its entirety by reference.

TECHNICAL FIELD

The embodiments of the present invention relate to a device and a cooling structure. More particularly, it relates to a device and a cooling structure for cooling heat-generating components mounted on a substrate.

BACKGROUND ART

Patent Document 1 discloses a technique regarding a cooling structure of a semiconductor module. Each heat-generating component (LSI (Large Scale Integration) 1) is thermally connected to a heat dissipation unit (heat sink 3). Therefore, heat of each heat-generating component is transferred to corresponding heat dissipation unit to cool a plurality of heat-generating components simultaneously. In this structure, a plurality of heat dissipation units can cool heat of a plurality of heat-generating components.

Patent Documents 2 to 5 relate to the present invention.
[Patent Document 1] JP-A-HEI 08-222672
[Patent Document 2] JP-A-HEI06-334357
[Patent Document 3] JP-A-2007-5397
[Patent Document 4] JP-A-2000-332177
[Patent Document 5] JP-A-2013-165120

In Patent Document 1, since a plurality of heat dissipation units are provided each corresponding to a heat-generating component, there are problems of a large number of components and poor assembly efficiency. In other words, when the number of heat-generating components increases, a heat dissipation unit is attached one by one for each increasing heat-generating component, and this decreases assembly efficiency.

SUMMARY

The present invention is made in view of such circumstances, and an object of the present invention is to provide an electronic device and a cooling structure which can efficiently cool a heat-generating component by a reduced number of components.

According to a non-limiting illustrative embodiment, a device comprising: a substrate; a heat-generating component which is mounted on a first surface of the substrate; a heat sink which is thermally coupled with the heat-generating component; and a frame which is attached on the first surface of the substrate, wherein the heat sink includes a first fin extending in a direction away from the first surface, and the frame includes a second fin which are arranged on the frame, and the second fin extends in a direction away from the first surface, and wherein the first fin extends higher than an bottom side of the second fin toward top side of second fin.

According to a non-limiting illustrative embodiment, a device comprising: a substrate; a processing unit which is mounted on a first surface of the substrate; a frame which is attached on the first surface of the substrate, and which includes an opening formed at a corresponding position of the processing unit; and a heat sink is thermally coupled with the processing unit through the opening, wherein the heat sink includes a first plurality of fins extending in a direction away from the first surface, wherein the frame includes a second plurality of fins extending in a direction away from the first surface, wherein the first fin extends higher than an bottom side of the second fin toward top side of second fin.

According to a non-limiting illustrative embodiment, a cooling structure comprising: a heat-generating component which is mounted on a first surface of a substrate; a heat sink which is thermally coupled with the heat-generating component; and a frame which is attached on the first surface of the substrate, wherein the heat sink includes a first fin extending in a direction away from the first surface, and the frame includes a second fin which are arranged on the frame, and the second fin extends in a direction away from the first surface, wherein the first fin extends higher than an bottom side of the second fin toward top side of second fin.

BRIEF DESCRIPTION OF THE DRAWINGS

Other features and advantages of various embodiments of the present invention will become apparent by the following detailed description and the accompanying drawings, wherein.

EXEMPLARY EMBODIMENT

First Exemplary Embodiment

A first exemplary embodiment of the present invention will be described in detail below.

Figure 1:
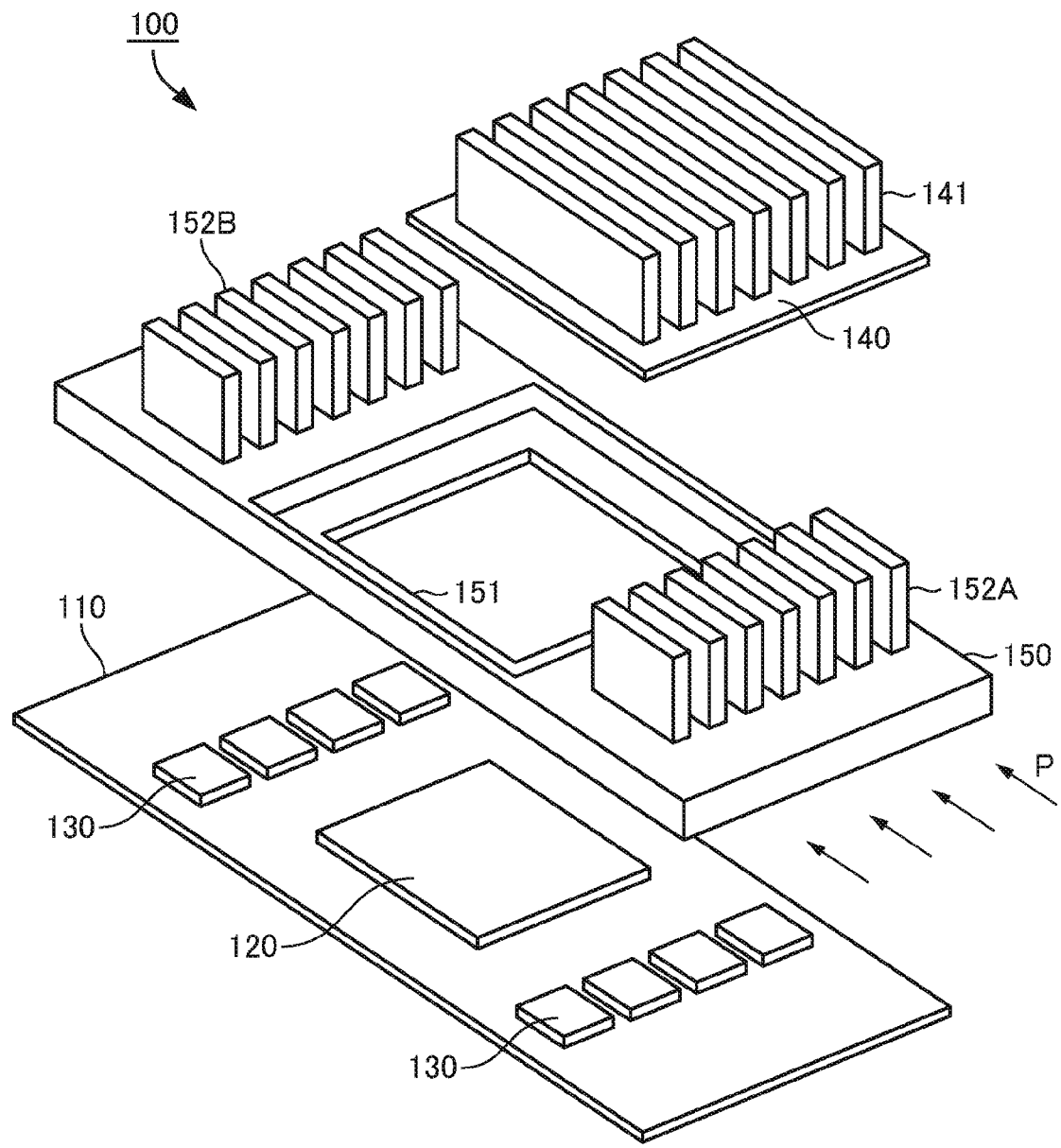
FIG. 1 is an exploded perspective view illustrating a configuration of an electronic device in a first exemplary embodiment of the present invention.
Figure 2:
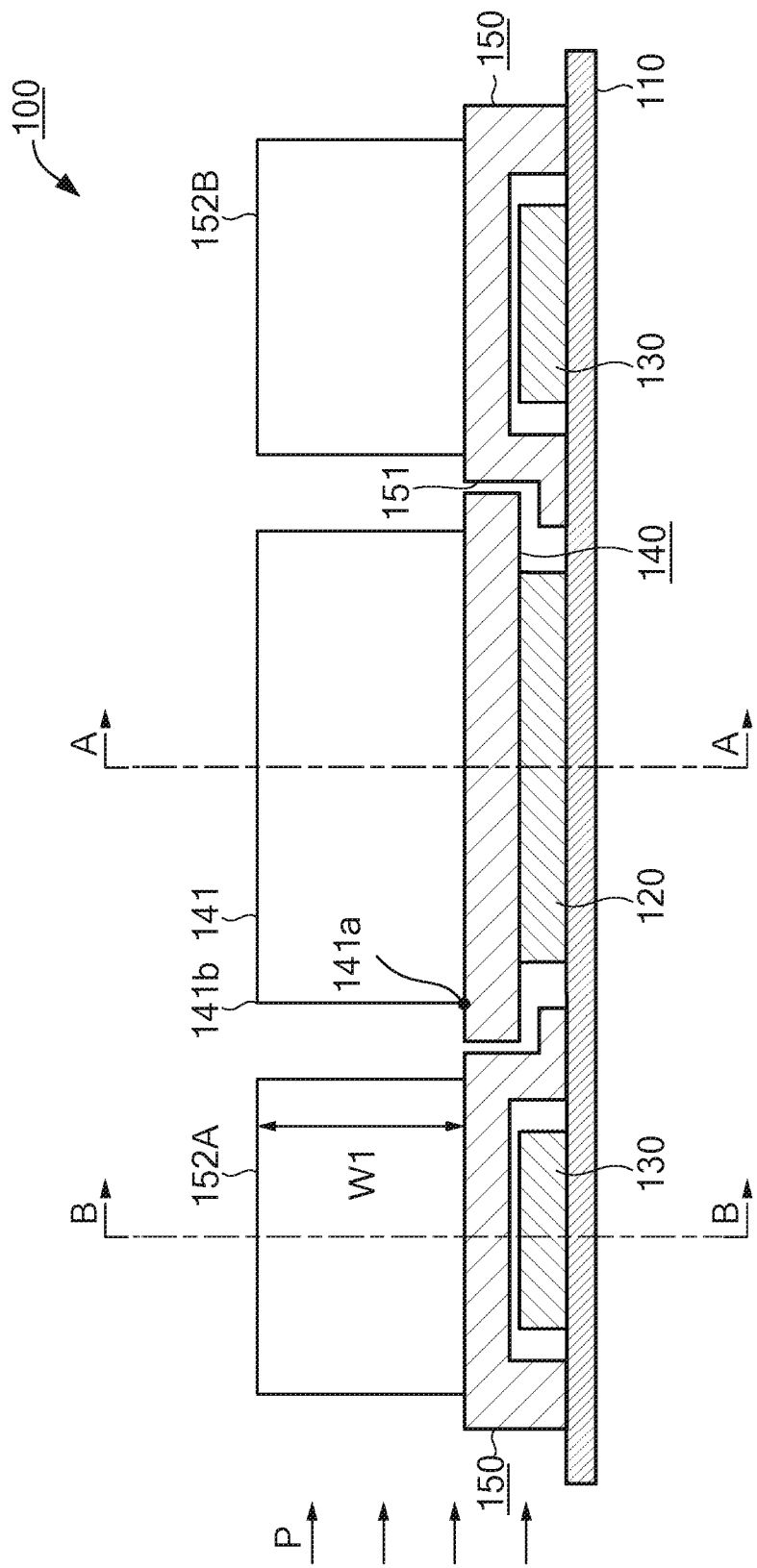
FIG. 2 is a cross-sectional view illustrating the configuration of the electronic device.
Figure 3:
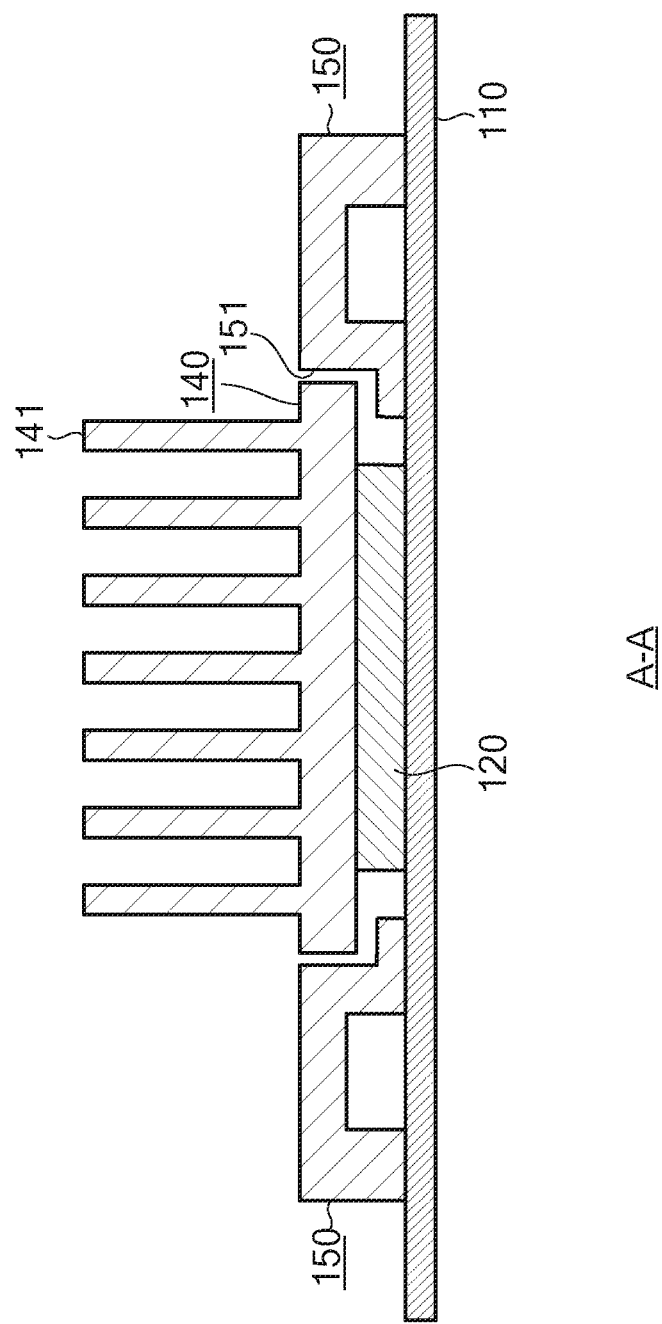
FIG. 3 is another cross-sectional view illustrating the configuration of the electronic device.
Figure 4:
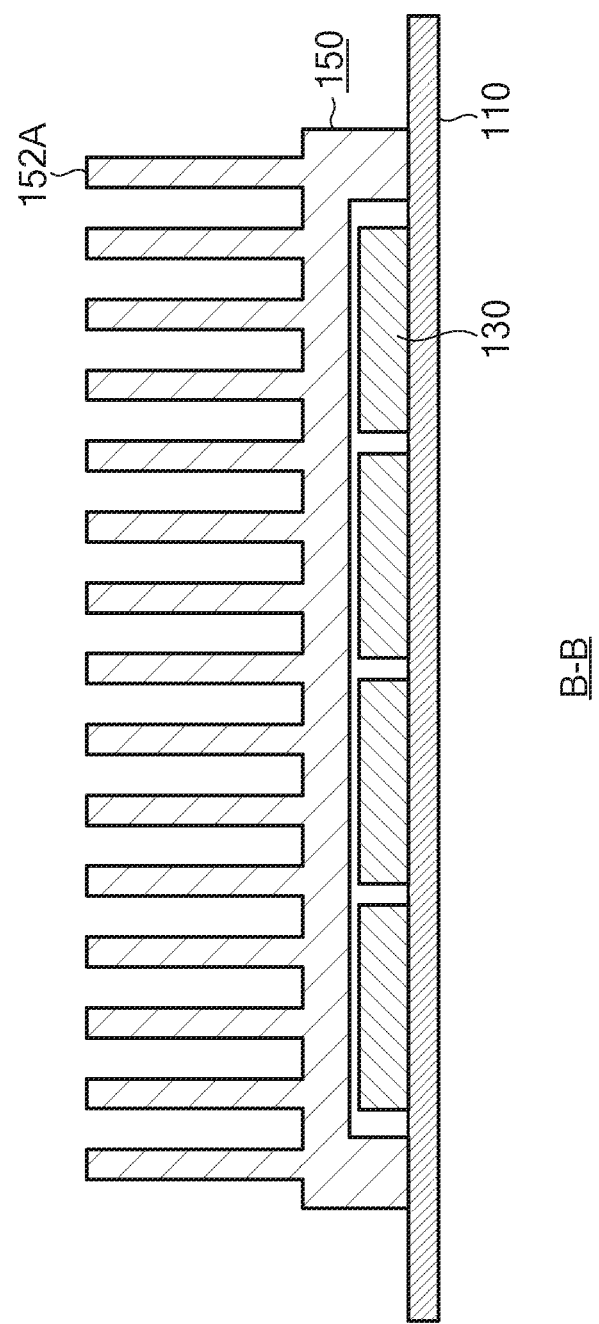
FIG. 4 is still another cross-sectional view illustrating the configuration of the electronic device.

FIG. 1 is an exploded perspective view illustrating a configuration of an electronic device 100. FIG. 2 is a cross-sectional view illustrating the configuration of the electronic device 100. FIG. 3 is another cross-sectional view illustrating the configuration of the electronic device 100, and is the cross-sectional view in A-A cross section of FIG. 2. FIG. 4 is still another cross-sectional view illustrating the configuration of the electronic device 100, and is the cross-sectional view in B-B cross section of FIG. 2.

Note that FIG. 4 is a drawing illustrating a configuration that the electronic device 100 is cut at a position including fins for frame 152A (refer to FIG. 1) described below. Also, a drawing illustrating a configuration that the electronic device 100 is cut at a position including fins for frame 152B described below is equivalent to FIG. 4, and it is omitted.

Referring to FIG. 1, the electronic device 100 according to the present invention includes a substrate 110, a CPU (Central Processing Unit) 120, memories 130, a heat dissipation unit 140, and a frame 150.

Referring to FIGS. 1, to 4, the substrate 110 is formed in a plate shape. A glass epoxy resin is used for the material of the substrate 110, for example. One CPU 120 and eight memories 130 are mounted on a surface of the substrate 110.

Note that only the CPU 120 may be mounted on the surface of the substrate 110 and the memories 130 may not be mounted. Also, only the memories 130 may be mounted on the surface of the substrate 110 and the CPU 120 may not be mounted. A plurality of CPUs 120 may be mounted on the surface of the substrate 110. The number of the memories 130 mounted on the surface of the substrate 110 is not limited to eight. Note that the surface of the substrate 110 is also called as a first surface.

Referring to FIGS. 1 to 3, the CPU 120 is mounted on the surface of the substrate 110 at a central part in a longitudinal direction thereof. The CPU 120 is a heat-generating component. Note that the heat-generating component means an electronic component which generates heat when operating.

Referring to FIG. 1, 2, and FIG. 4, the memories 130 are mounted on the surface of the substrate 110 and on both end sides in the longitudinal direction thereof. The memories 130 are other heat-generating components.

Referring to FIGS. 1 to 3, the heat dissipation unit 140 is provided so as to face the CPU 120 mounted on the surface on the substrate 110. In addition, the heat dissipation unit 140 is thermally coupled with the CPU 120. Metal materials or the like with high thermal conductivity, such as copper, iron and aluminum, are used for the material of the heat dissipation unit 140. The heat dissipation unit 140 is also called a heat sink.

Note that, in the examples illustrated in FIG. 1 to FIG. 3, the heat dissipation unit 140 and the CPU 120 are directly thermally coupled to each other. The heat dissipation unit 140 and the CPU 120 may be thermally coupled, for example, through a heat conduction sheet (not illustrated) or heat dissipation grease (not illustrated). Carbon fiber, silicon or the like is used for the material of the heat conduction sheet, for example. The heat dissipation grease means grease in which particles with high thermal conductivity are mixed. The material of base of the grease to be used may be denaturation silicon or the like, of which viscosity changes not so much within a range from room temperature to high temperature to some extent, for example. The material of particles with high thermal conductivity to be used may be copper, silver, aluminum, or the like, or may be alumina, magnesium oxide, aluminum nitride, or the like, for example.

Referring to FIG. 1 to 3, the heat dissipation unit 140 includes a plurality of fins for heat dissipation unit 141. The plurality of fins for heat dissipation unit 141 are provided so as to extend in a direction away from the surface of the substrate 110 in a plate shape. In addition, the plurality of fins for heat dissipation unit 141 are provided so as to extend along with a longitudinal direction of the substrate 110. A fin for the heat sink such as heat dissipation unit 141 is called as a first fin.

Referring to FIG. 1 to 4, the frame 150 is attached on the surface of the substrate 110 so as to cover the surface top of the substrate 110. The materials of the frame 150 to be used may be resin material, such as ABS (Acrylonitrile Butadiene Styrene: acrylonitrile butadiene styrene copolymerization synthetic resin) resin and polycarbonate, metal materials such as iron and aluminum, or the like.

The frame 150 includes an opening 151 and the plurality of fins for frame 152A and 152B.

The opening 151 is formed at the central part in the longitudinal direction of the frame 150. The opening 151 is formed at a position corresponding to a mounting position of the CPU 120. As illustrated in FIG. 2 3, the heat dissipation unit 140 and the CPU 120 are thermally coupled through the opening 151. As illustrated in FIG. 2, a rim of the opening 151 abuts on the surface of the substrate 110. In this structure, it is possible to suppress the substrate 110 from curving to the side opposite to the mounting side of the CPU 120 when the heat dissipation unit 140 is attached on the CPU 120.

The fins for frame 152A and 152B are formed on the frame 150. The fins for frame 152A and 152B are extended in a direction away from the surface of the substrate 110. The fins for frame 152A and 152B are arranged near the heat dissipation unit 140. The fins for frame 152A and 152B are arranged above the memories 130. The plurality of fins for frame 152A and 152B are provided so as to extend along the longitudinal direction of the substrate 110. A fin for a frame such as the frame 150 is also called a second fin. The fins for fames 152A and 152B are example of a second fin.

Referring to FIGS. 1 and 2, the heat dissipation unit 140 is provided between the fins for frame 152A and the fins for frame 152B. The fins for frame 152A and the fins for frame 152B are provided so that the fins may face the heat dissipation unit 140.

Figure 5:
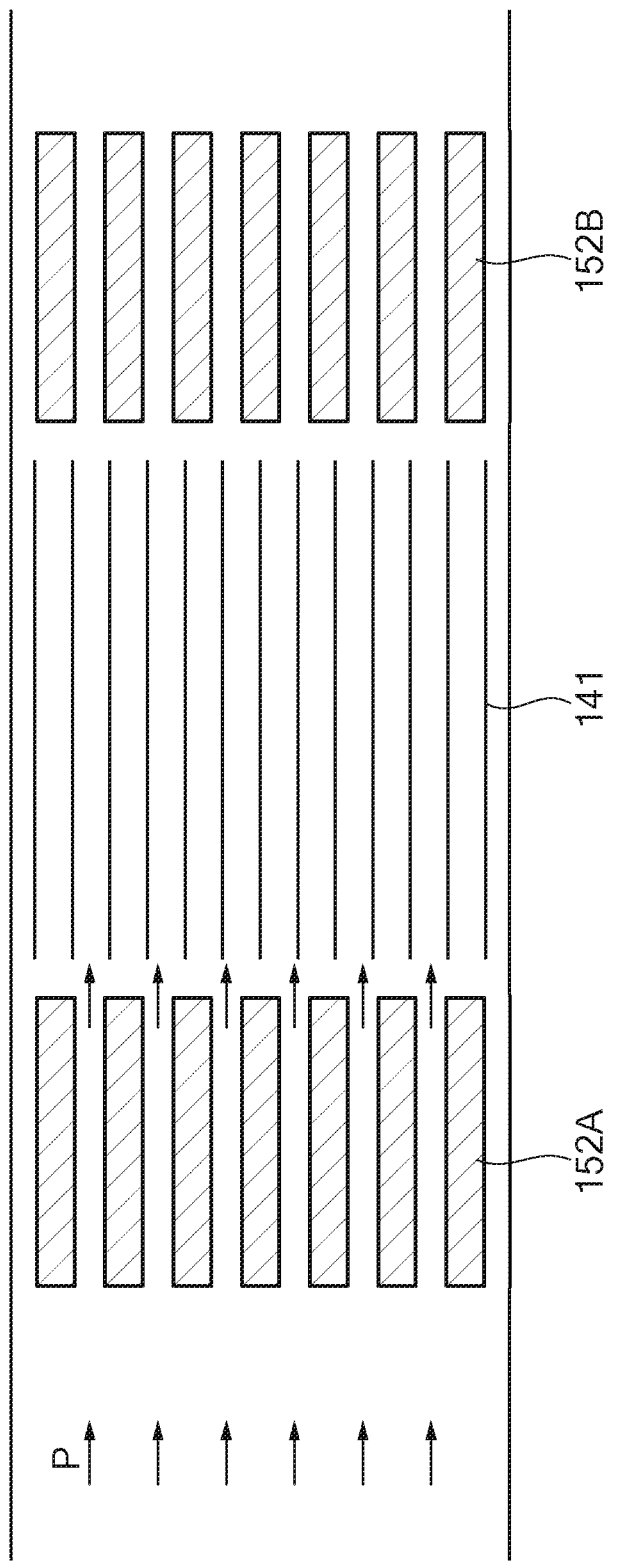
FIG. 5 is a top view schematically illustrating an arrangement relationship between fins for heat dissipation unit and fins for frame.

An arrangement relationship of the fins for heat dissipation unit 141 and the fins for frame 152A and 152B will be described. FIG. 5 is a top view schematically illustrating the arrangement relationship between the fins for heat dissipation unit 141 and the fins for frame 152A and 152B.

Referring to FIG. 5, each of the fins for frame 152A and 152B and the fins for heat dissipation unit 141 are provided close to each other. The fins for frame 152A and 152B are arranged parallel to an extending direction of the fins for heat dissipation unit 141.

Next, the operation of the first exemplary embodiment will be described.

Referring to FIG. 1, 2, and FIG. 5, for example, it is assumed that air flows in from the outside of the electronic device 100 in a direction of the arrow P.

Referring to FIG. 5, the air flow which flows in from the outside of the electronic device 100 flows through the fins for frame 152A, the fins for heat dissipation unit 141, and the fins for frame 152B in this order. In other words, of the first and second fins are arranged along the air flow in a row.

The fins for frame 152A and 152B are provided above the memories 130. In this structure, the fins for frame 152A and 152B mainly radiate the heat generated by the memories 130 into the air. The fins for frame 152A and 152B are also provided close to the CPU 120. In this structure, the fins for frame 152A and 152B can radiate heat generated by the memories 130 and heat generated by the CPU 120 into the air. Also, since the heat dissipation unit 140 is thermally connected with the CPU 120, the fins for heat dissipation unit 141 radiate heat generated by the CPU 120 into the air.

Referring to FIG. 5, the cool air flow which flows in from the outside of the electronic device 100 flows into each space between each two fins among the plurality of fins for frame 152A. At this stage, the heat of the memories 130 or the like radiated by the fins for frame 152A is cooled by the cool air flow.

Referring to FIG. 5, the cool air flow which flows in from the outside of the electronic device 100 passes through each space between each two fins among the plurality of fins for frame 152A, and then flows into each space between each two fins among the plurality of fins for heat dissipation unit 141.

Referring to FIG. 2, at least a part of each of the plurality of fins for frame 152A is located on a distal end 141b side of each fin for heat dissipation unit 141 rather than a base portion 141a of the fin for heat dissipation unit 141. In other words, the first fin extends higher than bottom side of the second fin toward top side of second fin.

In this structure, the cool air flow passed through the plurality of fins for frame 152A can flow into each space between each two fins among the plurality of fins for heat dissipation unit 141. In the example of FIG. 2, the cool air flow passed through the plurality of fins for frame 152A at least at the height W1 can flow into each space between each two fins among the plurality of fins for heat dissipation unit 141.

Figure 6:
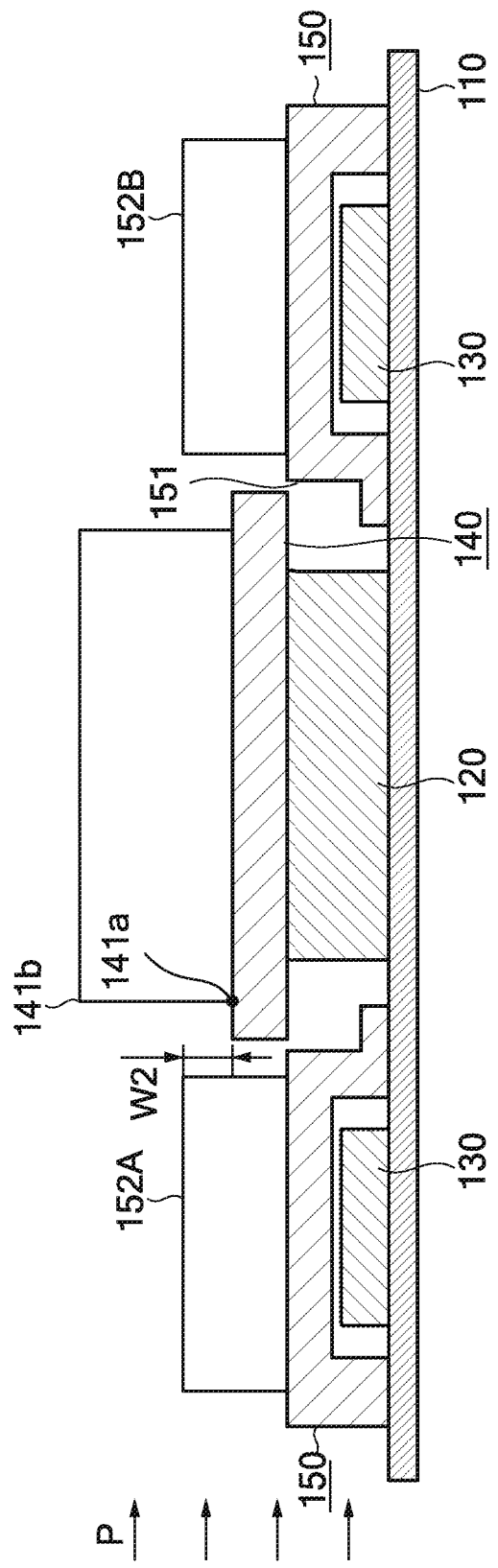
FIG. 6 is a cross-sectional view illustrating a configuration of a modification of an electronic device.

It is assumed that a substrate mounting height for the CPU 120 is different from a substrate mounting height for the memories 130. Also, it is assumed that air flows in from the outside of the electronic device 100 in the direction of the arrow P. FIG. 6 is a cross-sectional view illustrating a configuration of a modification of the electronic device 100, and corresponds to FIG. 2. FIG. 6 illustrates an example in which the substrate mounting height for the CPU 120 is different from the substrate mounting height from the memories 130. Note that the substrate mounting height means the distance between each of upper surfaces (top-side surfaces on the drawing) of the CPU 120 and the memories 130, and the surface of the substrate 110.

Referring to FIG. 6, it is assumed that the substrate mounting height for the CPU 120 is higher than the substrate mounting height for the memories 130.

The same structure as exemplified in FIG. 2 can also be applied in this case. At least a part of each of the plurality of fins for frame 152A is located on the distal end 141b side of each fin for heat dissipation unit 141 rather than the base portion 141a of the fin for heat dissipation unit 141. In other words, the first fin extends higher than bottom side of the second fin toward top side of second fin.

Therefore, the cool air flow passed through the plurality of fins for frame 152A can flow in each space between each two fins among the plurality of fins for heat dissipation unit 141. In the example of FIG. 6, at least at the height W2, the cool air flow passed through the plurality of fins for frame 152A can flow in each space between each two fins among the plurality of fins for heat dissipation unit 141.

Returning to FIG. 2 and FIG. 5, the cool air flow passed through the plurality of fins for frame 152A flows in each space between each two fins among the plurality of fins for heat dissipation unit 141. At this stage, the heat of the CPU 120 or the like radiated by the fins for heat dissipation unit 141 is cooled by the cool air flow.

Next, referring to FIG. 5, the cool air flow passed through the plurality of fins for heat dissipation unit 141 flows in each space between each two fins among the plurality of fins for frame 152B. At this stage, the heat of the memories 130 or the like radiated by the fins for heat frame 152B is cooled by the cool air flow.

As mentioned above, flowing the cool air into the electronic device 100 from the outside of the electronic device 100 along the direction of the arrow P enables efficient heat radiation of the heat of the CPU 120 and the memories 130 mounted on the surface of the substrate 110.

The electronic device 100 in the first exemplary embodiment of the present invention includes the substrate 110, the CPU 120 (heat-generating component), the heat dissipation unit 140, the frame 150, and the plurality of fins for frame 152A. The CPU 120 is mounted on the surface (first surface) of the substrate 110. The heat dissipation unit 140 includes the plurality of fins for heat dissipation unit 141, and is thermally coupled with the CPU 120. The plurality of fins for heat dissipation unit 141 extends in a direction away from the surface of the substrate 110. The frame 150 is attached on the surface of the substrate 110. The plurality of fins for frame 152A is arranged close to the heat dissipation unit 140 on the frame 150. Also, the plurality of fins for frame 152A extends in the direction away from the surface of the substrate 110. At least a part of each of the plurality of fins for frame 152A is located on the distal end 141b side of each fin for heat dissipation unit 141 rather than the base portion 141a of the fin for heat dissipation unit 141. In other words, the first fin extends higher than bottom side of the second fin toward top side of second fin.

In this way, the plurality of fins for frame 152A and 152B are formed on the frame 150 attached to the surface of the substrate 110. Therefore, the plurality of fins for frame 152A and 152B can radiate heat generated by a plurality of electronic components (such as the CPU 120, the plurality of memories 130) mounted on the surface of the substrate 110 into the air.

Therefore, even when a plurality of CPUs 120 is mounted on the substrate 110, for example, it is not necessary to provide the heat dissipation unit 140 for each CPU 120. In this way, in the electronic device 100, heat-generating components can be efficiently cooled by the small number of components.

As mentioned above, in the technique described in Patent Document 1, since a plurality of heat dissipation units are provided each corresponding to a heat-generating component, there are problems of large number of components and poor assembly efficiency. When the number of heat-generating components increases, attaching a heat dissipation unit one by one for each increasing heat-generating component decreases assembly efficiency. On the other hand, in the electronic device 100 according to the present invention, the fins for frame 152A and 152B are provided on the frame 150 attached to the surface of the substrate 110. In this structure, the fins for frame 152A and 152B also radiate heat generated by a plurality of electronic components (for example, memories 130) mounted on the surface of the substrate 110 into the air. Therefore, the electronic device 100 according to the present invention can efficiently cool heat-generating components with a small number of components.

In addition, in the invention described in Patent Document 2, it is assumed that cooling is performed only with a frame 1 (mechanical component). On the other hand, in the electronic device 100 according to the present invention, both the heat dissipation unit 140 and the frame 150 cool heat-generating components. In other words, in the electronic device 100 according to the present invention, the heat dissipation unit 140 mainly cools the heat-generating component (the CPU 120) which generates large amount of heat. In addition, the frame 150 (mechanical component) mainly cools components (memories 130) which generates smaller amount of heat than the CPU 120. However, this matter is not disclosed in Patent Document 2.

In the electronic device 100, the plurality of fins for frame 152A are arranged close to the heat dissipation unit 140 on the frame 150. Therefore, the plurality of fins for frame 152A can also efficiently radiate heat of the CPU 120 thermally coupled with the heat dissipation unit 140 into the air.

In addition, at least a part of each of the plurality of fins for frame 152A is located on the distal end 141*b* side of each fin for heat dissipation unit 141 rather than the base portion 141*a* of the fin for heat dissipation unit 141. In other words, the first fin extends higher than bottom side of the second fin toward top side of second fin. Therefore, for example, the cool air flow passed through the plurality of fins for frame 152A can smoothly flow in each space between each two fins among the plurality of fins for heat dissipation unit 141. In this manner, the heat of the CPU 120 radiated by the plurality of fins for heat dissipation unit 141 can be efficiently cooled by the cool air flow.

In the electronic device 100 in the first exemplary embodiment of the present invention, the plurality of fins for frame 152A are provided so as to face the heat dissipation unit 140. Furthermore, the plurality of fins for frame 152A is arranged parallel to an extending direction of the plurality of fins for heat dissipation unit 141. In other words, the first plurality of fins and the second plurality of fins are arranged along the air flow in a row. In this structure, the cool air flow passed through the plurality of fins for frame 152A can smoothly flow into each space between each two fins among the plurality of fins for heat dissipation unit 141. As a result, the heat of the CPU 120 radiated into the air by the plurality of fins for heat dissipation unit 141 can be efficiently cooled by the cool air flow. Note that the invention described in Patent Document 2 is not primarily provided with a member corresponding to the heat dissipation unit 140. Therefore, the invention described in Patent Document 2 does not include a configuration in which the plurality of fins for frame 152A is arranged parallel to an extending direction of the plurality of fins for heat dissipation unit 141.

In the electronic device 100 in the first exemplary embodiment of the present invention, the plurality of fins for frame 152A and 152B are provided close to the memories 130 (heat-generating components). The memories 130 are heat-generating components other than the CPU 120. In this structure, the plurality of fins for frame 152A and 152B can radiate heat generated by the memories 130 into the air. As a result, the electronic device 100 can cool the memories 130 mounted on the surface of the substrate 110 more efficiently.

Next, a second exemplary embodiment of the present invention will be described in detail.

Figure 7:
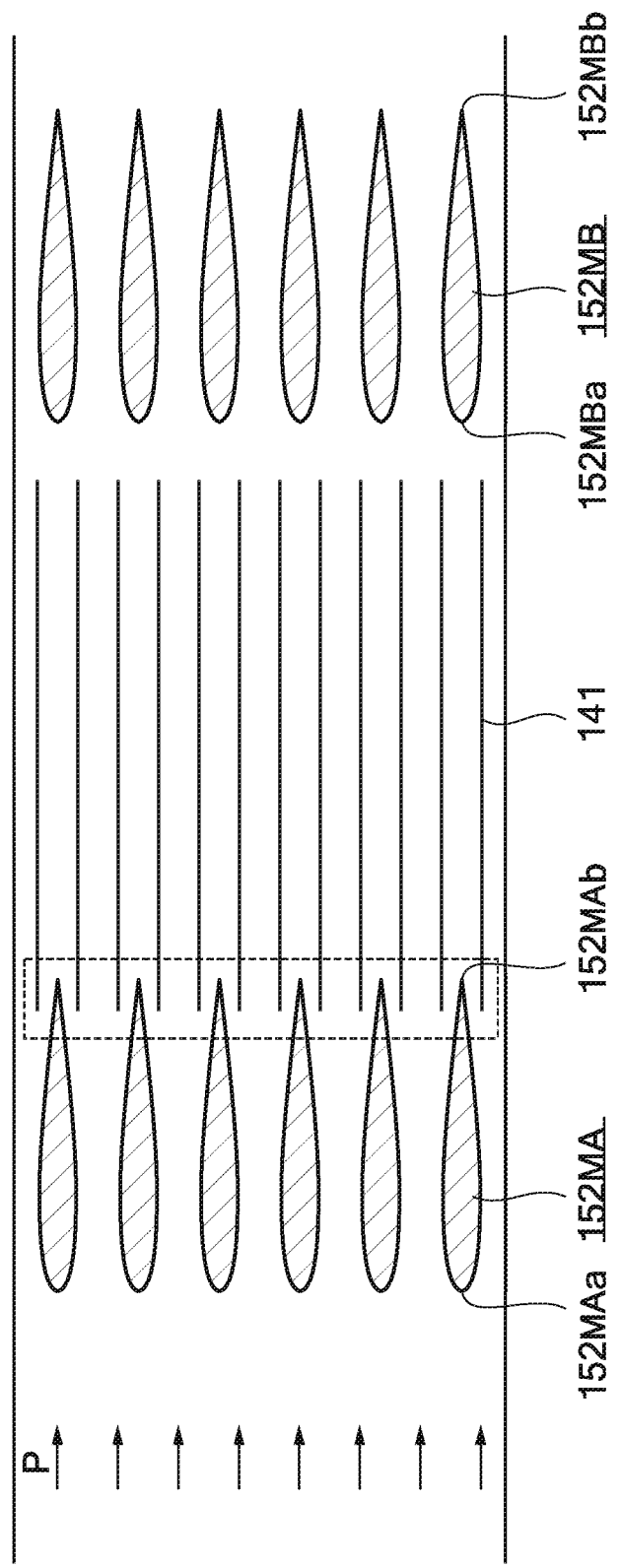
FIG. 7 is a top view illustrating an arrangement relationship between fins for heat dissipation unit and fins for frame in a second exemplary embodiment of the present invention.

FIG. 7 is a top view illustrating an arrangement relationship between fins for heat dissipation unit and fins for frame in the second exemplary embodiment. FIG. 7 corresponds to FIG. 5. Note that in FIG. 7, to each component equivalent to a component illustrated in FIG. 1 to FIG. 6, a reference sign equivalent to the reference sign illustrated in FIG. 1 to FIG. 6 is given.

Referring to FIG. 7, fins for frame 152MA and 152MB are arranged parallel to an extending direction of fins for heat dissipation unit 141. As is the case with the first exemplary embodiment, the fins for frame 152MA and 152MB are arranged close to the heat dissipation unit 140 on a frame 150. The fins for frame 152MA and 152MB are formed on the frame 150 so as to extend in a direction away from the surface of a substrate 110. The fins for frame 152MA and 152MB are formed on the frame 150 parallel to an extending direction of the fins for heat dissipation unit 141. In other words, the first fins and the second fins are arranged along the air flow in a row. The fins for frame 152MA and 152MB are arranged on the frame 150 above memories 130.

Now, FIG. 5 is compared with FIG. 7. As illustrated in FIG. 5, the thickness of the fins for frame 152A and 152B is constant along with the extending direction thereof. On the other hand, as illustrated in FIG. 7, the thickness of the fins for frame 152MA and 152MB differs along with the extending direction. In other words, the cross-sectional shape of the fins for frame 152MA and 152MB is set to an airfoil shape (a streamline shape). Both are different from each other in this matter.

Referring to FIG. 7, the thickness of an end 152MAb of each of a plurality of fins for frame 152MA on a side of the heat dissipation unit (right side on the drawing in FIG. 7) is thinner than a gap between two fins among the plurality of fins for heat dissipation unit 141. As illustrated in a frame with a dotted line in FIG. 7, each of the ends 152MAb of the plurality of fins for frame 152MA on the side of the heat dissipation unit is arranged between two fins among the plurality of fins for heat dissipation unit 141.

Referring to FIG. 7, the thickness of the plurality of fins for frame 152MA on the side of the heat dissipation unit is set so as to become thinner toward the heat dissipation unit 140.

Referring to FIG. 7, the thickness of another end 152MAa of each of the plurality of fins for frame 152MA on a side opposite to the heat dissipation unit (windward side of the cool air flow (left side on the drawing in FIG. 7)) is set so as to become thicker toward the heat dissipation unit 140.

Next, the operation of the second exemplary embodiment will be described.

Referring to FIG. 7, it is assumed that air flows in from outside of the electronic device in a direction of the arrow P, for example.

Referring to FIG. 7, the air flow which flows in from the outside of the electronic device flows through the fins for frame 152MA, the fins for heat dissipation unit 141, and the fins for frame 152MB in this order.

In this case, the fins for frame 152MA and 152MB are provided above the memories 130. Therefore, the fins for frame 152MA and 152MB mainly radiate heat generated by the memories 130 into the air. The fins for frame 152MA and 152MB are also provided close to the CPU 120. In this structure, the fins for frame 152MA and 152MB can radiate heat generated by the memories 130 and heat generated by the CPU 120 into the air. Also, since the heat dissipation unit 140 is thermally coupled with the CPU 120, the fins for heat dissipation unit 141 radiate heat generated by the CPU 120 into the air.

Referring to FIG. 7, the cool air flow flows in from the outside of the electronic device flows into each space between each two fins among the plurality of fins for frame 152MA. At this stage, the heat of the memories 130 or the like radiated by the fins for frame 152MA is cooled by the cool air flow.

Referring to FIG. 7, the cool air flow which flows in from the outside of the electronic device passes through the plurality of fins for frame 152MA. After that, the cool air flow which flows in from the outside of the electronic device flows into each space between each two fins among the plurality of fins for heat dissipation unit 141. In other words, the first fins and the second fins are arranged along the air flow in a row.

Referring to FIG. 7, the thickness of the end 152MAa of each of the plurality of fins for frame 152MA on a side opposite to the heat dissipation unit (windward side of the cool air flow (left side on the drawing)) is set so as to become thicker toward the heat dissipation unit 140. In this structure, air resistance of the plurality of fins for frame 152MA is reduced against the cool air flow flowing in from the outside of the electronic device. As a result, the cool air flow which flows in from the outside of the electronic device smoothly flows into each space between each two fins among the plurality of fins for frame 152MA.

Referring to FIG. 7, thickness of the end 152MAb of each of the plurality of fins for frame 152MA on the side of the heat dissipation unit is set so as to become thinner toward the heat dissipation unit 140. In this structure, air resistance of the plurality of fins for frame 152MA is reduced against the cool air flow flowing in from the outside of the electronic device. As a result, the cool air flow which flows in from the outside of the electronic device smoothly flows from the plurality of fins for frame 152MA into each space between each two fins among the plurality of fins for heat dissipation unit 141.

Referring to FIG. 7, the thickness of the end 152MAb of each of the plurality of fins for frame 152MA on the side of the heat dissipation unit is thinner than a gap between two fins among the plurality of fins for heat dissipation unit 141. Also, the end 152MAb of each of the plurality of fins for frame 152MA on the side of the heat dissipation unit is arranged between two fins among the plurality of fins for heat dissipation unit 141. In this structure, the electronic device can cause the cool air flow passed through the plurality of fins for frame 152MA to flow smoothly into each space between each two fins among the plurality of fins for heat dissipation unit 141, while reducing the air resistance.

Note that, as described using FIG. 2 and FIG. 6, at least a part of each of the plurality of fins for frame 152MA is located on the distal end 141b side of each fin for heat dissipation unit 141 rather than the base portion 141a of the fin for heat dissipation unit 141. In other words, the first fin extends higher than bottom side of the second fin toward top side of second fin. In this structure, the cool air flow passed through the plurality of fins for frame 152MA can flow into each space between each two fins among the plurality of fins for heat dissipation unit 141. In the example of FIG. 2, the cool air flow passed through the plurality of fins for frame 152MA at least at the height W1 can flow into each space between each two fins among the plurality of fins for heat dissipation unit 141. In the example of FIG. 6, the cool air flow passed through the plurality of fins for frame 152MA at least at the height W2 can flow into each space between each two fins among the plurality of fins for heat dissipation unit 141.

Returning to FIG. 7, the cool air flow passed through the plurality of fins for frame 152MA flows in each space between each two fins among the plurality of fins for heat dissipation unit 141. At this stage, the heat of the CPU 120 or the like radiated by the fins for heat dissipation unit 141 is cooled by the cool air flow.

Referring to FIG. 7 the cool air flow passed through the plurality of fins for heat dissipation unit 141 flows in each space between each two fins among the plurality of fins for frame 152MB. At this stage, the heat of the memories 130 or the like radiated by the fins for heat dissipation unit 152B is cooled by the cool air flow.

Referring to FIG. 7, thickness of an end 152MB a of each of the plurality of fins for frame 152MB on a side of the heat dissipation unit (windward side of the cool air flow (left side on the drawing)) is set so as to become thicker with increasing distance from the heat dissipation unit 140. In this structure, the air resistance of the plurality of fins for frame 152MB is reduced against the cool air flow passed through the plurality of fins for heat dissipation unit 141. As a result, the cool air flow which flows in from the outside of the electronic device flows into each space between each two fins among the plurality of fins for frame 152MB more smoothly.

As illustrated in FIG. 7, thickness of an end 152MBb of each of the plurality of fins for frame 152MB on a side opposite to the heat dissipation unit side is set so as to become thinner with increasing distance from the heat dissipation unit 140. In this structure, the air resistance of the plurality of fins for frame 152MB is reduced against the cool air flow passed through the plurality of fins for frame 152MB. As a result, the cool air flow passed through the plurality of fins for frame 152MB smoothly flows outward (right side on the drawing).

As mentioned above, by flowing the cool air flowing in from the outside of the electronic device into the electronic device along the direction of the arrow P, it is possible to efficiently radiate heat of the CPU 120 and the memories 130 mounted on the surface of the substrate 110.

As mentioned above, in the electronic device according to the second exemplary embodiment of the present invention, the thickness of the end 152MAb of each of the plurality of fins for frame 152MA on the side of the heat dissipation unit is thinner than the gap between each two fins among the plurality of fins for heat dissipation unit 141. Also, the end 152MAb of each of the plurality of fins for frame 152MA on the side of the heat dissipation unit is arranged between two fins among the plurality of fins for heat dissipation unit 141. In this structure, the electronic device can causes the cool air flow passed through the plurality of fins for frame 152MA to flow into each space between each two fins among the plurality of fins for heat dissipation unit 141 more smoothly, while reducing the air resistance.

In the electronic device according to the second exemplary embodiment of the present invention, the thickness of the end 152MAb of each of the plurality of fins for frame 152MA on the side of the heat dissipation unit is set become thinner toward the heat dissipation unit 140. In this structure, air resistance of the plurality of fins for frame 152MA is reduced against the cool air flow flowing in from the outside of the electronic device. As a result, the cool air flow which flows in from the outside of the electronic device flows into each space between each two fins among the plurality of fins for heat dissipation unit 141 more smoothly from the plurality of fins for frame 152MA.

In the electronic device according to the second exemplary embodiment of the present invention, the thickness of the end 152MAa of each of the plurality of fins for frame 152MA on a side opposite to the heat dissipation unit (windward side of the cool air flow (left side on the drawing)) is set so as to become thicker toward the heat dissipation unit 140. In this structure, air resistance of the plurality of fins for frame 152MA is reduced against the cool air flow flowing in from the outside of the electronic device. As a result, the cool air flow which flows in from the outside of the electronic device flows into each space between each two fins among the plurality of fins for frame 152MA more smoothly.

Note that Patent Document 3 discloses a technique in which curved radiation fins 32 are attached to an outer circumference of a body 31 of a radiator unit. Patent Document 4 discloses a technique in which a plurality of airfoil-shape (streamline shape) fins 13 is formed in a heat sink 1. On the other hand, the fins for frame 152MA and 152MB of the present invention are formed on the frame 150, but are not formed on the heat dissipation unit 140. In this point, the present invention completely differs from the inventions described in Patent Documents 3 and 4. Furthermore, the present invention specifies the arrangement positions of the fins for frame 152MA and 152MB in relation to the fins for heat dissipation unit 141, and the like. Also in this point, the present invention completely differs from the inventions described in Patent Documents 3 and 4.

Next, a third exemplary embodiment of the present invention will be described in detail.

Figure 8:
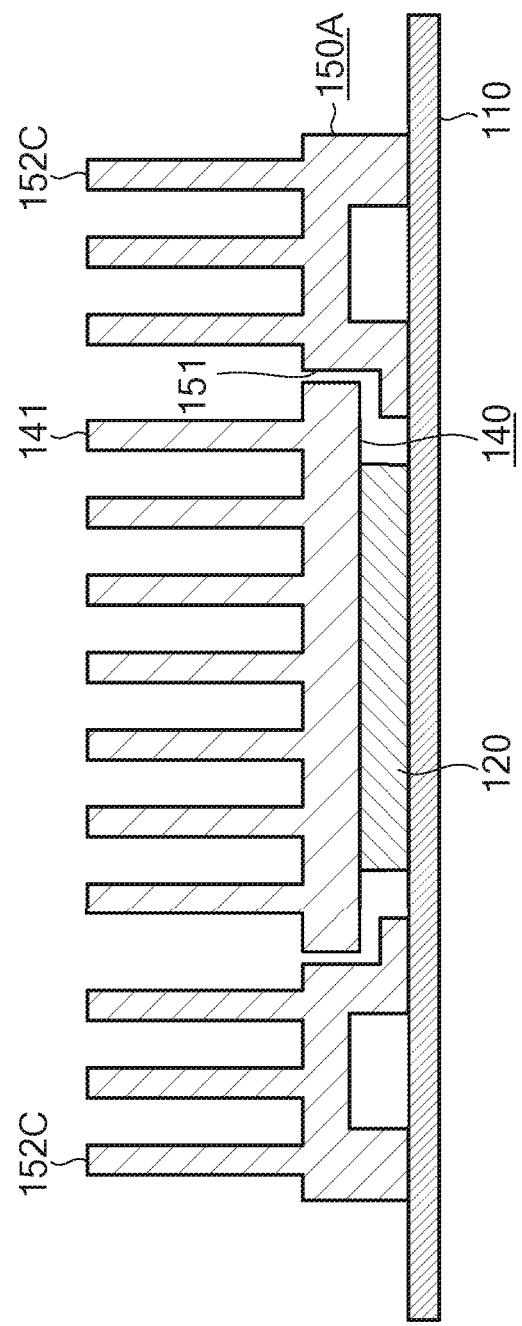
FIG. 8 is a cross-sectional view illustrating a configuration of an electronic device in a third exemplary embodiment of the present invention.

FIG. 8 is a cross-sectional view illustrating a configuration of an electronic device in the third exemplary embodiment of the present invention. FIG. 8 is a drawing corresponding to FIG. 3 in the first exemplary embodiment. Note that in FIG. 8, to each component equivalent to a component illustrated in FIG. 1 to FIG. 7, a reference sign equivalent to the reference sign illustrated in FIG. 1 to FIG. 7 is given.

Referring to FIG. 8, a frame 150A includes fins for frame 152C. The fins for frame 152C are formed in a region other than a region in which a heat dissipation unit 140 is provided in FIG. 8. In this structure, heat of the electronic components mounted on the substrate 110 can be more efficiently radiated into the air.

Also, the fins for frame 152C are formed close to the CPU 120. In this structure, the fins for frame 152C can more efficiently radiate heat generated by the CPU 120 into the air.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A device comprising:
   a substrate;
   a heat-generating component which is mounted on a first surface of the substrate;
   a frame which is attached on the first surface of the substrate, and which includes an opening formed at a corresponding position of the heat-generating component; and
   a heat sink which is thermally coupled with the heat-generating component through the opening,
   wherein the heat sink includes a first plurality of fins which extend in a direction away from the first surface, and the frame includes a second plurality of fins which are arranged on the frame, and the second plurality of fins which extend in a direction away from the first surface,
   wherein a top side of the first plurality of fins is higher than a bottom side of the second plurality of fins,
   wherein the frame includes a flange which is provided on a rim of the opening, and
   wherein the flange abuts on the first surface.

2. The device according to claim 1, wherein the first and second plurality of fins are arranged along a direction of air flow.

3. The device according to claim 2, wherein the first and second plurality of fins are arranged along the direction of air flow which is from the outside of the device.

4. The device according to claim 3, wherein a thickness of each of the second plurality of fins on the side of the heat sink is thinner than the thickness of each of the second plurality of fins on a side opposite to the heat sink.

5. The device according to claim 1,
   wherein a thickness of each end of the second plurality of fins on a side of the heat sink is thinner than a gap between the plurality of the first fins, and
   wherein each end of the second plurality of fins on the side of the heat sink is arranged between the plurality of the first fins.

6. The device according to claim 1, wherein the plurality of the second fins are arranged above a second heat-generating component.

7. The device according to claim 1,
   wherein the first and second plurality of fins are arranged parallel to an extending direction of the first and second plurality of fins.

8. A cooling structure comprising:
   a heat-generating component which is mounted on a first surface of a substrate;
   a frame which is attached on the first surface of the substrate, and which includes an opening formed at a corresponding position of the heat-generating component; and
   a heat sink which is thermally coupled with the heat-generating component through the opening,
   wherein the heat sink includes a first plurality of fins which extend in a direction away from the first surface, and the frame includes a second plurality of fins which are arranged on the frame, and the second plurality of fins which extend in a direction away from the first surface,
   wherein a top side of the first plurality of fins is higher than a bottom side of the second plurality of fins,
   wherein the frame includes a flange which is provided on a rim of the opening, and
   wherein the flange abuts on the first surface.

9. A device comprising:
   a substrate;
   a processing unit which is mounted on a first surface of the substrate;
   a frame which is attached on the first surface of the substrate, and which includes an opening formed at a corresponding position of the processing unit; and
   a heat sink is thermally coupled with the processing unit through the opening,
   wherein the heat sink includes a first plurality of fins extending in a direction away from the first surface,
   wherein the frame includes a second plurality of fins extending in a direction away from the first surface,
   wherein a top side of the first plurality of fins is higher than a bottom side of the second plurality of fins,
   wherein the frame includes a flange which is provided on a rim of the opening, and
   wherein the flange abuts on the first surface.

* * * * *